United States Patent [19]

Engel

[11] 4,220,932
[45] Sep. 2, 1980

[54] BUFFER AMPLIFIER

[75] Inventor: Christopher M. Engel, Arlington Heights, Ill.

[73] Assignee: Zenith Radio Corporation, Glenview, Ill.

[21] Appl. No.: 957,637

[22] Filed: Nov. 3, 1978

[51] Int. Cl.² .............................................. H03F 3/18
[52] U.S. Cl. ................................... 330/289; 330/307; 330/311
[58] Field of Search ................ 307/313; 330/289, 307, 330/310, 311

[56] References Cited

U.S. PATENT DOCUMENTS

| 2,963,656 | 12/1960 | Parris | 330/310 X |
| 4,123,723 | 10/1978 | Sugawara | 330/311 |

Primary Examiner—James B. Mullins

[57] ABSTRACT

A buffer amplifier is described for use in an integrated circuit in which a siganl from a processing circuit is coupled by the buffer amplifier to an output pin on the integrated circuit. The buffer amplifier includes a pair of transistors, the first of which receives the output of the processing circuit and is preferably arranged in an emitter-follower configuration. A resistor internal to the integrated circuit is coupled between ground and the emitter of the first transistor. The second transistor, preferably a vertical PNP type transistor, is arranged in a circuit configuration to couple the output of the first transistor to the output pin and to sink any current flowing to the output pin from a circuit driven by the buffer amplifier.

7 Claims, 4 Drawing Figures

BUFFER AMPLIFIER

BACKGROUND OF THE INVENTION

This invention is directed generally to buffer amplifiers and in particular to buffer amplifiers constructed as part of an integrated circuit.

It is conventional to include a buffer amplifier at the output of a signal processing circuit for isolating the latter circuit from another circuit which is to receive and amplify or otherwise operate on the output of the signal processing circuit. Frequently, the buffer amplifier is designed to provide some power amplification of the signal from the processing circuit and to provide a low output impedance.

In some cases, the signal processing circuit and the buffer amplifier are constructed on the same integrated circuit chip, and the circuit driven by the buffer amplifier (hereinafter, the driven circuit) is external to that chip. Connection between the buffer amplifier and the driven circuit is usually via an output pin on the integrated circuit chip. In that type of arrangement, it is customary to design the buffer amplifier with short circuit protection so that inadvertent grounding of the output pin does not result in destruction of the buffer amplifier.

Conventionally designed buffer amplifiers with such short circuit protection may include a resistor which is external to the integrated circuit and which is coupled between the output pin and ground to sink current from the driven circuit. However, the difference between temperature-induced variations in the value of the external resistor and temperature-induced variations in the characteristics of the buffer amplifier may result in undesirable fluctuations in the voltage at the output pin of the integrated circuit. Moreover, the external resistor, in addition to being undesirable from a cost standpoint, also draws extra current from the conventional buffer amplifier.

Another frequently desired function of an integrated circuit buffer amplifier is that it compensates for temperature-induced variations in the quiescent output voltage from the processing circuit. This function has been difficult to achieve in buffer amplifiers having an external resistor because of mismatch between the temperature coefficient of the external resistor and those of the components in the buffer amplifier. Hence, the operation of such conventional integrated circuit buffer amplifiers has not been entirely satisfactory, particularly from the standpoint of temperature compensation.

OBJECTS OF THE INVENTION

It is a general object of the invention to provide an improved buffer amplifier which overcomes the deficiencies noted above.

It is a further object of the invention to provide a buffer amplifier which is suitable for construction in integrated circuit form and which sinks current from the driven circuit without the use of an external resistor.

It is yet another object of the invention to provide a simple integrated circuit buffer amplifier which includes short-circuit protection and which compensates for temperature-induced variations in the quiescent output voltage from the signal processing circuit, all without the use of an external resistor.

BRIEF DESCRIPTION OF THE FIGURES

The above-mentioned objects and other objects of the invention are more particularly set forth in the following detailed description and in the accompanying drawings of which.

SUMMARY OF THE INVENTION

The buffer amplifier described herein is formed on an integrated circuit which includes a signal processing circuit and an output pin, the latter of which is adapted to be coupled to a driven circuit which feeds current toward the output pin. To couple the output of the signal processing circuit to the output pin, and thence to the driven circuit, the buffer amplifier includes a first transistor whose base electrode receives the output of the signal processing circuit. The emitter electrode of the first transistor is coupled to a voltage reference, such as ground, through a resistor which is internal to the integrated circuit. A second transistor is coupled to the emitter electrode of the first transistor and disposed in a circuit arrangement between the first transistor and the output pin such that the second transistor passes to the output pin substantially the same signal received by the base electrode of the first transistor, and such that the second transistor sinks the current flowing from the driven circuit toward the output pin.

By virtue of this construction, the need for a current-sinking resistor external to the integrated circuit is eliminated. Also eliminated is the attendant mismatch between the temperature coefficient of an external resistor and the temperature coefficients of circuit elements internal to the integrated circuit.

DESCRIPTION OF THE PREFERRED EMBODIMENT

Figure 1:
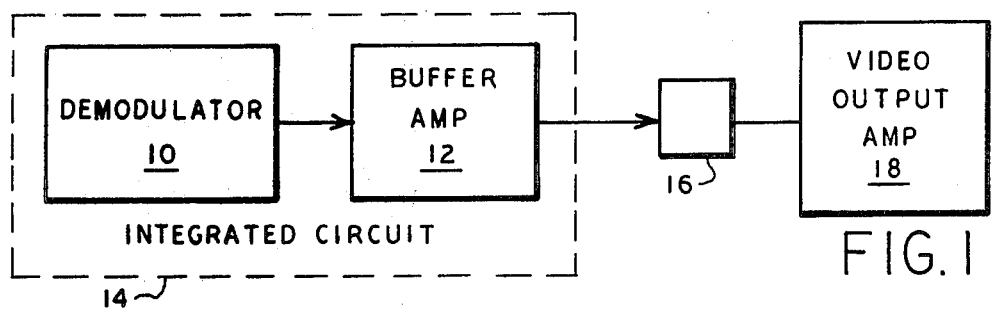
FIG. 1 is a block diagram of an exemplary system in which the invention may be used.

Referring first to FIG. 1, there is shown a block diagram of an exemplary system in which the buffer amplifier according to the invention is advantageously used. The illustrated system is a conventional one found in modern television receivers and includes a signal processor in the form of a conventional demodulator 10 for demodulating the 3.58 MH color signals. One output of the demodulator 10 is coupled to the input of a buffer amplifier 12. Both the demodulator 10 and the buffer amplifier 12 are part of a single integrated circuit 14.

The output of the buffer amplifier 12 is connected to an output pin 16 associated with the integrated circuit 14. The pin 16, in turn, is coupled to the input of a video output amplifier 18 for driving a television picture tube (not shown). Generally, the picture tube is driven by three video output amplifiers, each receiving a demodulated color signal from one of three buffer amplifiers. The three buffer amplifiers are, in turn, each driven by one of three outputs of the demodulator 10. For clarity, however, only a single demodulator output, a single buffer amplifier, and a single video output amplifier are shown.

As indicated above, the buffer amplifier 12 should be constructed to provide short-circuit protection in the event that the pin 16 becomes inadvertently grounded. In addition, provision must be made for sinking current flowing from the video output amplifier 18 toward the pin 16. Up till now, these functions have been provided by a conventional buffer amplifier such as buffer amplifier 20 of FIG. 2.

Figure 2:
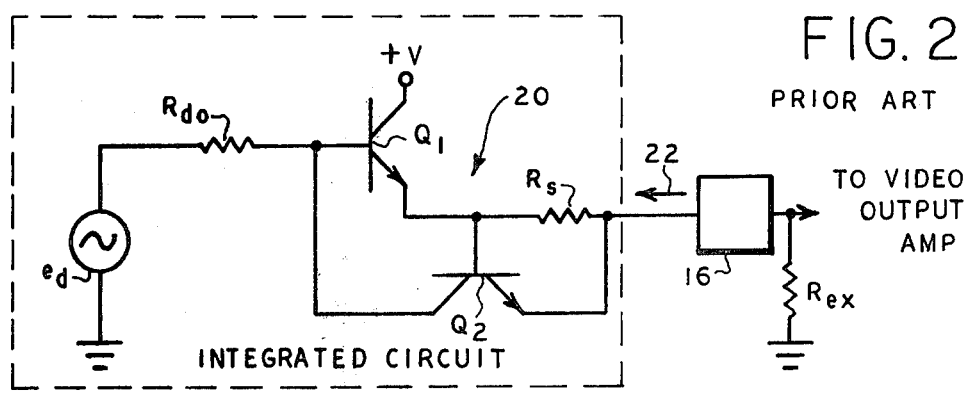
FIG. 2 illustrates a prior art buffer amplifier as used in the system of FIG. 1.

As shown in FIG. 2, the demodulator 10 is depicted as a voltage source $e_D$ in series with a driving source impedance $R_{DO}$, the latter being coupled to the input of the buffer amplifier 20. The buffer amplifier 20 includes a transistor $Q_1$ connected in an emitter follower configuration with a resistor $R_s$ and another transistor $Q_2$. Specifically, the emitter of $Q_1$ is coupled with the resistor $R_s$ to the output pin 16 of the integrated circuit. The transistor $Q_2$ is connected as shown in a conventional feed-back arrangement to limit the current flowing to pin 16 when the latter becomes inadvertently grounded. However, because the buffer amplifier 20 cannot sink current flowing in the direction indicated by the arrow 22, a resistor $R_{EX}$, external to the integrated circuit, is connected between pin 16 and ground. Thus, current flowing from the video output amplifier toward the pin 16 finds a path to ground via the external resistor $R_{EX}$.

The fact that the buffer amplifier 20 requires an external, current sinking resistor leads to several undesirable results. First, because the temperature coefficient of the external resistor $R_{EX}$ differs from the temperature coefficients associated with the components of the buffer amplifier 20, temperature-induced changes in the values of the components of the buffer amplifier 20 are not matched by a corresponding change in the value of the resistor $R_{EX}$. As a result, the quiescent voltage at the pin 16 tends to change with changes in temperature. Such a voltage change is amplified by the video output amplifier and may result in color changes at the picture tube.

Secondy, a temperature-induced change in the quiescent value of the source voltage $e_D$ is not readily compensated for by the buffer amplifier 20. Once again, that is because of the mismatch between the temperature coefficients of the components in the buffer amplifier 20 and the temperature coefficient of the resistor $R_{EX}$.

Figure 3:
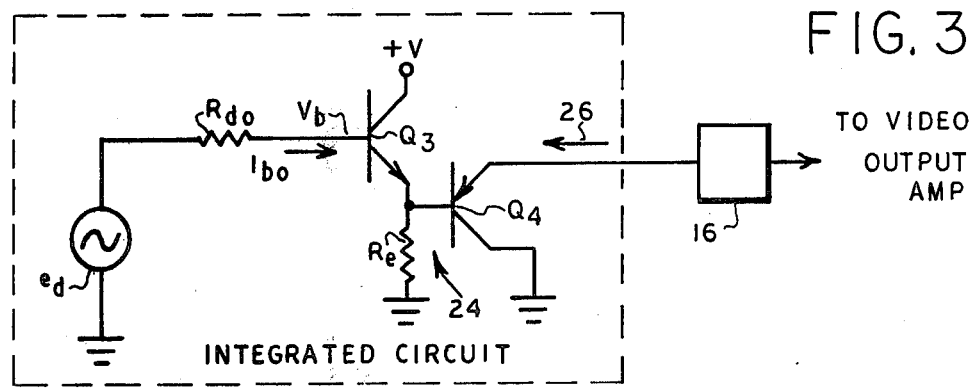
FIG. 3 illustrates a buffer amplifier according to the invention as used in the system of FIG. 1.

A simple and economical buffer amplfier 24 which overcomes the above-noted deficiencies is shown in FIG. 3 in which the demodulator 10 is again represented by a source voltage $e_D$ in series with a driving source impedance $R_{DO}$. The buffer amplifier 24 includes a first transistor $Q_3$ which is internal to the integrated circuit and which has its base electrode connected in series with the impedance $R_{DO}$ to receive the output of the demodulator. The emitter electrode of the transistor $Q_3$ is coupled to a voltage reference shown as ground through a resistor $R_E$ which is fabricated on the same integrated circuit chip as the transistor $Q_3$. With the collector electrode connected to a voltage source, the transistor $Q_3$ acts as an emitter follower, whereby the signal received by its base electrode also appears at its emitter electrode, less the base-to-emitter voltage drop.

To couple the signal from the transistor $Q_3$ to the output pin 16, and to sink the current flowing from the video output amplifier, a second transistor $Q_4$ is coupled to the emitter electrode of the transistor $Q_2$ and disposed in a circuit arrangement between the transistor $Q_3$ and the output pin 16 such that it passes to the pin 16 substantially the same signal as received by the base of the transistor $Q_3$ and such that the transistor $Q_4$ acts as a sink to current flowing in the direction indicated by the arrow 26. The transistor $Q_4$ is also adapted to turn off when the pin 16 is grounded to provide short circuit protection.

To provide the functions noted above, the transistor $Q_4$ is a so-called "vertical" PNP transistor constructed according to conventional integrated circuit technology. As is typical of "vertical" PNP's, the transistor $Q_4$ has a lower beta (current gain) and $f_t$ (high frequency cut-off point) than NPN transistors manufactured on the same chip. However, it also has a higher reverse base-emitter breakdown voltage, typically from twenty to thirty volts. The latter feature of "vertical" PNP's is advantageously used in the embodiment of FIG. 3 to provide short-circuit protection. The illustrated circuit configuration eliminates the need for an external currentsinking resistor and its attendant disadvantages.

Specifically, the transistor $Q_4$ is connected by its base electrode to the emitter electrode of the transistor $Q_3$. The collector electrode of the transistor $Q_4$ is grounded and its emitter electrode is connected to the pin 16. Thus, the transistor $Q_4$ also acts as an emitter follower to provide a reasonably low output impedance to the video output amplifier, while simultaneously sinking current therefrom in the direction of the arrow 26. Because of the relatively high reverse base-emitter breakdown voltage of the transistor $Q_4$, grounding of the pin 16 will not cause the base emitter junction of the transistor $Q_4$ to break down—it merely becomes reverse-biased and turns off. As a result, no current flows from the buffer amplifier 24 to the pin 16, and damage to the buffer amplifier (as well as to the demodulator) is avoided.

Particularly significant is the fact that the buffer amplifier 24 provides a temperature stable output voltage at pin 16. This result is achieved in part because the temperature coefficients of transistors $Q_3$ and $Q_4$ tend to cancel in the illustrated configuration. Moreover, the fact that no external current sinking resistor is required means that there are no mismatches between the temperature coefficients of the impedance $R_{DO}$ and that of any external resistor. This fact enables the buffer amplifier 24 to maintain the voltage at pin 16 relatively stable as temperature changes. For example, as the temperature of the integrated circuit rises, the value of $R_E$ decreases, and the emitter and base current of transistor $Q_3$ increase. However, the value of $R_{DO}$ also decreases, so the voltage drop across $R_{DO}$ remains essentially constant. As a result, the voltage at pin 16 remains unchanged.

Figure 4:
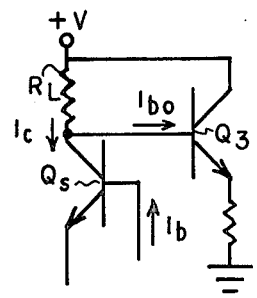
FIG. 4 illustrates an exemplary circuit useful in describing certain design parameters of the buffer amplifier of FIG. 3.

The inclusion of $R_E$ as illustrated in the integrated circuit also permits compensation of predictable temperature-induced changes in the value of the source voltage $e_D$. For example, where the demodulator 10 (or any other type of signal processing circuit) includes an output transistor whose collector current $I_c$ passes through a load resistor to develop a voltage output signal for driving the buffer amplifier 24, that output signal is typically a function of the base current of the output transistor. More specifically, again by way of example, FIG. 4 shows an output transistor $Q_5$ whose collector is coupled to a load resistor $R_L$. The voltage output signal which is applied to the base of the transistor $Q_3$ is taken from the junction between the resistor $R_L$ and the collector of the transistor $Q_5$. With changes in temperature, the current gain of the output transistor $Q_5$ changes, thereby also changing the value of its base current $I_b$ as well as the voltage output signal.

To compensate for the temperature-induced change in the value of the voltage output signal, the value of the resistor $R_E$ is selected such that the base current $I_{bo}$ of the transistor $Q_3$ is substantially equal in magnitude to the portion or multiple of the quiescent base current of transistor $Q_5$ present in the collector current $I_c$ of the output transistor $Q_5$ when no chroma signal is applied to the demodulator 10. For example, in the case where the transistor $Q_5$ forms part of a differential amplifier, the collector current $I_c$ of the transistor $Q_5$ may be expressed as $I_c = I_o - KI_b$ where $I_o$ is a known constant current, K is a substantially constant factor, and $I_b$ is the quiescent base current of the transistor $Q_5$. Hence, the collector current $I_c$ includes a known multiple (K) of the quiescent base current of the transistor $Q_5$. The output voltage signal at the collector of transistor $Q_5$ is also a function of that known multiple of the quiescent base current $I_b$. By selecting the value of $R_E$ such that $I_{bo}$ is substantially equal $KI_b$, any temperature-induced changes in the collector current $I_c$ of the transistor $Q_5$, due to changes in the base current $I_b$, are matched by a corresponding change in the base current $I_{bo}$ of the transistor $Q_3$. Hence, the total current through the resistor $R_L$ remains constant, as does the voltage input signal to the transistor $Q_3$. That same unvarying voltage is coupled to the output pin 16 by the buffer amplifier.

In selecting $R_E$, it will be understood that the design value of the quiescent voltage at pin 16 will be known. Moreover, in the embodiment shown in FIG. 3 the voltage at the base electrode of the transistor $Q_3$ will be substantially equal to the design value of the quiescent voltage at pin 16. Hence, the value of $R_E$ is selected to be substantially equal to $(V_b - V_{be})$ divided by $[KI_b \times (1+\text{beta})]$, where $V_b$ is the design quiescent voltage at the base electrode of transistor $Q_3$, $V_{be}$ is the voltage across the base-emitter junction of the transistor $Q_3$, and beta is the current gain of the transistor $Q_3$. By this configuration and selection, the design value of the quiescent voltage at pin 16 remains substantially constant despite temperature changes in the integrated circuit, particularly temperature-induced changes in transistor current gain.

The above-described buffer amplifier 24 provides very satisfactory results in terms of temperature compensation. Moreover, its simplicity and lack of an external emitter resistor make it eminently useful for inclusion in integrated circuit designs where short circuit protection is desirable.

Although the invention has been described in terms of a specific embodiment, it will be obvious to those skilled in the art that many alterations and variations thereto may be made without departing from the spirit and scope of the invention. Accordingly, it is intended that all such modifications and alterations be included within the scope of the invention as defined by the appended claims.

What is claimed is:

1. In an integrated circuit, a buffer amplifier for coupling the output of a signal processing circuit to an output pin on the integrated circuit, which output pin is adapted to be coupled to a driven circuit feeding current toward the output pin, the buffer amplifier comprising:

an NPN transistor internal to the integrated circuit having a base electrode and an emitter electrode, said base electrode receiving the output of the signal processing circuit;

a resistor internal to the integrated circuit and coupled between the emitter electrode of said NPN transistor and ground, and a vertical PNP transistor internal to the integrated circuit and having a base electrode, an emitter electrode, and a grounded collector electrode, the base electrode of said PNP transistor being connected to the emitter electrode of said NPN transistor, and the emitter electrode of said PNP transistor being connected to the output pin, whereby the use of a current-sinking resistor external to the integrated circuit, and the attendant mismatch between the temperature coefficient of an external resistor and the temperature coefficients of circuit elements internal to the integrated circuit, are eliminated.

2. A buffer amplifier as set forth in claim 1 wherein said PNP transistor is selected to have a reverse base-emitter breakdown voltage sufficient to avoid breakdown of its base-emitter junction when the output pin is grounded.

3. In an integrated circuit, a buffer amplifier for coupling the output signal processing circuit to an output pin on the integrated circuit, said signal processing circuit having an output transistor which has a quiescent base current wherein said output signal is a function of a known multiple of said quiescent base current, and said output pin is adapted to be coupled to a driven circuit feeding current toward the output pin, the buffer amplifier comprising:

a first transistor internal to the integrated circuit and having a base electrode and an emitter electrode, said base electrode receiving the output signal of the signal processing circuit;

a second transistor coupled to the emitter electrode of said first transistor and disposed in a circuit arrangement between said first transistor and the output pin such that said second transistor passes to the output pin substantially the same signal received by the base electrode of said first transistor and such that said second transistor sinks the current flowing from the driven circuit toward the output pin; and a resistor internal to the integrated circuit and coupled between the emitter electrode of said first transistor and ground, the value of said resistor being selected such that the base current of said first transistor is substantially equal in magnitude to a known multiple of the quiescent base current of said output transistor, whereby changes in base currents due to temperature-induced changes in the current gains of said output transistor and said first transistor cause substantially no change in the magnitude of the signal coupled to the output pin of the integrated circuit.

4. In an integrated circuit, a buffer amplifier for coupling the output signal of a signal processing circuit to an output pin on the integrated circuit, said signal processing circuit having an output transistor which has a quiescent base current wherein said output signal is a function of a known multiple of said quiescent base current, and said output pin is adapted to be coupled to a driven circuit feeding current toward the output pin, the buffer amplifier comprising:

an NPN transistor internal to the integrated circuit having a base electrode and an emitter electrode, said base electrode receiving the output signal of the signal processing circuit;

a vertical PNP transistor internal to the integrated circuit and having a base electrode, an emitter electrode, and a grounded collector electrode, the base electrode of said PNP transistor being connected to the emitter electrode of said NPN transistor, and the emitter electrode of said PNP transistor being connected to the output pin; and a resistor internal to the integrated circuit and coupled between the emitter electrode of said NPN transistor and ground, the value of said resistor being selected such that the base current of said NPN transistor is substantially equal in magnitude to said known multiple of the quiescent base current of said output transistor, whereby changes in base currents due to temperature-induced changes in the current gains of said output transistor and said NPN transistor cause substantially no change in the magnitude of said output signal and substantially no change in the magnitude of the signal coupled to the output pin of the integrated circuit.

5. In an integrated circuit, a buffer amplifier for coupling the output of a signal processing circuit to an output pin on the integrated circuit, which output pin is adapted to be coupled to a driven circuit feeding current toward the output pin, the buffer amplifier comprising:

a first transistor internal to the integrated circuit and having a base electrode and an emitter electrode, said base electrode receiving the signal output of the signal processing circuit;

a resistor internal to the integrated circuit and coupled between the emitter electrode of said first transistor and ground; and a second transistor disposed in a circuit arrangement between said first transistor and the output pin such that said second transistor passes to the output pin substantially the same signal received by the base electrode of said first transistor and such that said second transistor sinks the current flowing from the driven circuit toward the output pin, said second transistor including a base electrode coupled to the emitter electrode of said first transistor, an emitter electrode coupled to the output pin, and a grounded collector electrode;

whereby the use of a current-sinking resistor external to the integrated circuit, and the attendant mismatch between the temperature coefficient of an external resistor and the temperature coefficients of circuit elements internal to the integrated circuit, are eliminated.

6. A buffer amplifier as set forth in claim 5 wherein said second transistor is selected to have a reverse base-emitter breakdown voltage sufficient to avoid breakdown of the base-emitter junction of said second transistor when the output pin is grounded.

7. A buffer amplifier as set forth in claim 5 wherein said second transistor is a vertical PNP transistor.

* * * * *